(12) United States Patent
Soer et al.

(10) Patent No.: US 8,242,471 B2
(45) Date of Patent: Aug. 14, 2012

(54) RADIATION SOURCE AND LITHOGRAPHIC APPARATUS INCLUDING A CONTAMINATION TRAP

(75) Inventors: Wouter Anthon Soer, Nijmegen (NL); Vadim Yevgenyevich Banine, Helmond (NL); Tjarko Adriaan Rudolf Van Empel, Eindhoven (NL); Erik Roelof Loopstra, Eindhoven (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 12/431,423

(22) Filed: Apr. 28, 2009

(65) Prior Publication Data

US 2009/0272917 A1    Nov. 5, 2009

Related U.S. Application Data

(60) Provisional application No. 61/071,441, filed on Apr. 29, 2008, provisional application No. 61/136,131, filed on Aug. 14, 2008, provisional application No. 61/136,304, filed on Aug. 26, 2008.

(51) Int. Cl.
 *G01J 3/10* (2006.01)
(52) U.S. Cl. .................................................. 250/504 R
(58) Field of Classification Search ............... 250/504 R, 250/492.1
 See application file for complete search history.

(56) References Cited

U.S. PATENT DOCUMENTS

| | | | |
|---|---|---|---|
| 6,838,684 B2* | 1/2005 | Bakker et al. | 250/492.2 |
| 7,033,308 B2* | 4/2006 | Fujimoto et al. | 483/13 |
| 7,034,308 B2* | 4/2006 | Bakker et al. | 250/370.08 |
| 7,087,914 B2* | 8/2006 | Akins et al. | 250/504 R |
| 7,091,505 B2* | 8/2006 | Singer et al. | 250/504 R |
| 7,164,144 B2* | 1/2007 | Partlo et al. | 250/504 R |
| 7,230,258 B2* | 6/2007 | Ruzic et al. | 250/504 R |
| 7,297,968 B2* | 11/2007 | Endo et al. | 250/504 R |
| 7,619,233 B2* | 11/2009 | Fujimoto | 250/504 R |
| 7,705,334 B2* | 4/2010 | Yabuta et al. | 250/504 R |
| 2003/0006383 A1 | 1/2003 | Melnychuk et al. | |
| 2005/0199829 A1 | 9/2005 | Partlo et al. | |
| 2006/0192151 A1 | 8/2006 | Bowering et al. | |

(Continued)

FOREIGN PATENT DOCUMENTS

EP    1 274 287 B1    6/2005

(Continued)

OTHER PUBLICATIONS

European Search Report for European Application No. 09005144.2 dated Jul. 2, 2009.

(Continued)

*Primary Examiner* — Jack Berman
*Assistant Examiner* — Eliza Osenbaugh-Stewart
(74) *Attorney, Agent, or Firm* — Pillsbury Winthrop Shaw Pittman LLP

(57) ABSTRACT

A radiation source includes a radiation emitter configured to emit radiation, a collector configured to collect the radiation, and a contamination trap configured to trap contamination emitted by the radiation source. The contamination trap includes a plurality of foils that extend substantially radially, a first magnet ring configured to lie outside of an outer conical trajectory of radiation that is collected by the collector, and a second magnet ring configured to lie within the trajectory of radiation that is collected by the collector. The magnet rings are configured to provide a magnetic field that includes a component that is parallel to the foils.

11 Claims, 7 Drawing Sheets

U.S. PATENT DOCUMENTS

| | | |
|---|---|---|
| 2007/0114469 A1 | 5/2007 | Partlo et al. |
| 2008/0157006 A1* | 7/2008 | Wilhelmus Van Herpen et al. .......................... 250/492.2 |
| 2010/0032590 A1* | 2/2010 | Bykanov et al. .......... 250/504 R |

FOREIGN PATENT DOCUMENTS

| | | |
|---|---|---|
| JP | 2005-020006 A | 1/2005 |
| JP | 2006-520107 A | 8/2006 |
| JP | 2006-332654 A | 12/2006 |
| JP | 2007-273749 A | 10/2007 |
| WO | WO2006/135546 A2 | 12/2006 |

OTHER PUBLICATIONS

Japanese Office Action for Japanese Patent Application No. 2009-103511, mailed on Jul. 20, 2011.

* cited by examiner

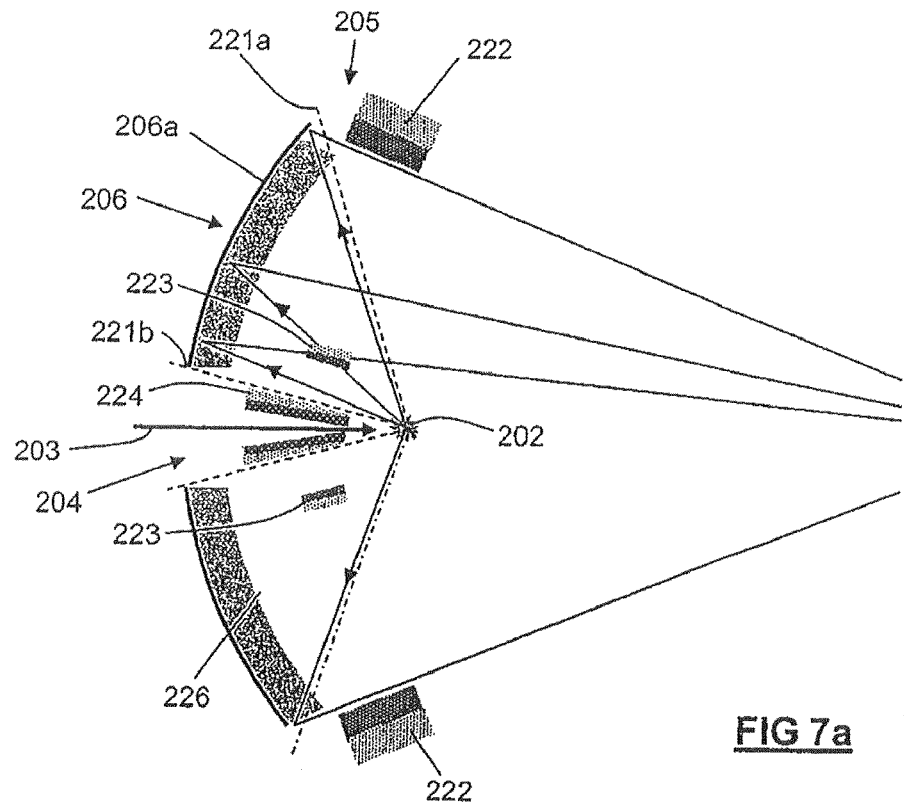
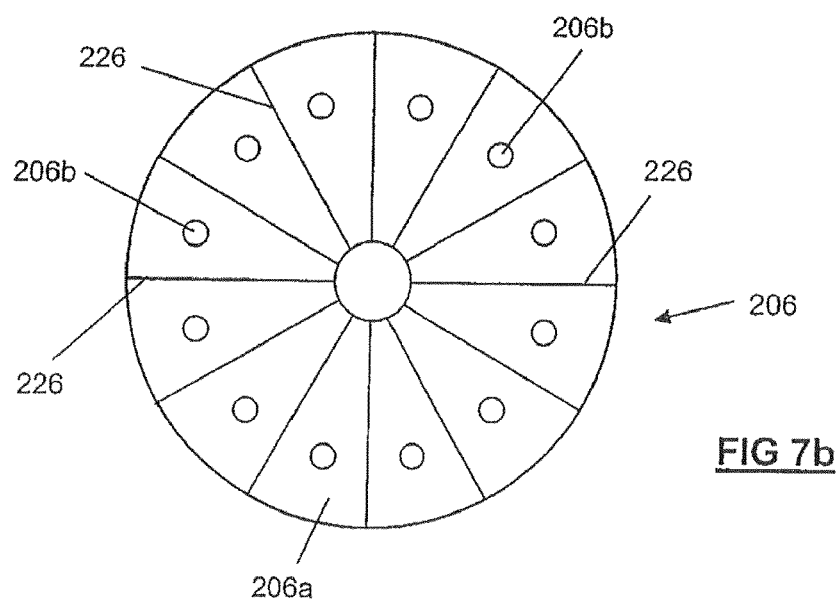

RADIATION SOURCE AND LITHOGRAPHIC APPARATUS INCLUDING A CONTAMINATION TRAP

CROSS-REFERENCE TO RELATED APPLICATIONS

This application claims the benefit of priority from U.S. Provisional Patent Application Nos. 61/071,441, filed Apr. 29, 2008, 61/136,131, filed Aug. 14, 2008, and 61/136,304, filed Aug. 26, 2008, the entire contents of all of which are incorporated herein by reference.

FIELD

The present invention relates to a radiation source, and to a lithographic apparatus which includes such a source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation having a wavelength within the range of 10-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV'.

Extreme ultraviolet radiation and beyond EUV radiation may be produced using a plasma. The plasma may be created for example by directing a laser at particles of a suitable material (e.g. tin), or by directing a laser at a stream of a suitable gas or vapor, such as Xe gas or Li vapor. The resulting plasma emits extreme ultraviolet radiation (or beyond EUV radiation), which is collected using a collector such as a mirrored grazing incidence collector, which receives the extreme ultraviolet radiation and focuses the radiation into a beam.

In addition to extreme ultraviolet radiation, the plasma produces contamination in the form of particles, such as thermalized atoms, ions, nanoclusters, and/or microparticles. The contamination is projected, together with the extreme ultraviolet radiation, towards the collector and may cause damage to the grazing incidence collector.

It is therefore desirable to prevent contamination from entering and damaging the collector or to reduce the amount of contamination that enters and damages the collector.

An apparatus that may be used to prevent contamination from entering and damaging the collector, or to reduce the amount of contamination that enters and damages the collector, is a foil trap. A foil trap comprises a plurality of planar foil members that are located between an emission point of a radiation source, and the collector. The planar foil members are aligned such that they are radially aligned with respect to the emission point, so that the planar foil members obscure as little radiation as possible that is emitted from the emission point. In other words, the planar foil members are oriented such that they are parallel to the direction of travel of the radiation. The foil trap may be used to trap particles, the particles impinging against and/or being caught by the planar foil members. The functionality of the foil trap may be improved by rotating the foil trap, and/or by introducing a buffer gas in the vicinity of (e.g. in-between) adjacent planar foil members. Alternatively, a buffer gas may be used in conjunction with a foil trap in a configuration where the foil trap does not act primarily to trap particles but to cool the buffer gas. For example, in such a configuration, the distance between the planar foil members may be larger.

When used in conjunction with an EUV radiation source, the heat load on the planar foil members is high. The high heat load can lead to degradation, damage or destruction of the planar foil members. Centrifugal forces associated with the rotation of the foil trap can make the degradation, damage or destruction of the planar foil members more likely. When a buffer gas is used in conjunction with a foil trap, the heat load on the buffer gas will also be high, and may be so high as to be unacceptable.

It is therefore desirable to reduce the heat load on a foil trap and/or a buffer gas used in conjunction with such a foil trap.

SUMMARY

According to an aspect of the present invention, there is provided a radiation source comprising a radiation emitter, a contamination trap and a collector, wherein the contamination trap comprises a plurality of foils which extend substantially radially, a first magnet ring which lies outside of an outer conical trajectory of radiation which is collected by the collector, and a second magnet ring which lies within the trajectory of radiation which is collected by the collector, wherein the magnet rings are configured to provide a magnetic field which includes a component that is parallel to the foils.

The collector may include a plurality of reflective shells provided within one another, and the second magnet ring is associated with a reflective shell of the collector.

At least one of the magnet rings may be substantially aligned with a reflective shell.

At least one of the magnet rings may be provided between a terminating edge of one of the reflective shells and the radiation emitter.

At least one of the magnet rings may be provided in the collector in a shadow area which extends from one of the reflective shells.

The collector may comprise a collector mirror arranged to receive radiation from the radiation emitter and reflect it towards a focus.

According to an aspect of the present invention, there is provided a lithographic apparatus comprising a source of EUV radiation, an illumination system for conditioning the EUV radiation, a support structure for supporting patterning device, the patterning device serving to impart the radiation beam with a pattern in its cross-section, a substrate table for holding a substrate, and a projection system for projecting the patterned radiation beam onto a target portion of the substrate, wherein the radiation source comprises a radiation emitter, a contamination trap and a collector, wherein the contamination trap comprises a plurality of foils which extend substantially radially, a first magnet ring which lies outside of an outer conical trajectory of radiation which is collected by the collector, and a second magnet ring which lies within the trajectory of radiation which is collected by the collector, wherein the magnet rings are configured to provide a magnetic field which includes a component that is parallel to the foils.

According to an aspect of the present invention, there is provided a radiation source comprising: a radiation emitter for emitting radiation; a collector for collecting radiation emitted by the radiation emitter; and a plurality of planar members that are oriented such that the planar members extend parallel to radiation emitted by the radiation emitter, wherein at least one of the plurality of planar members is in contact with the collector.

A majority of the plurality of planar members may be in contact with the collector, or all of the plurality of planar members may be in contact with the collector.

The collector may comprise a collector mirror. The at least one of the plurality of planar members may be attached to the collector mirror. The at least one of the plurality of planar members may be located in one or more slits provided in the collector mirror. The collector mirror may be provided with one or more apertures. A gas may be arranged to be provided through the one or more apertures.

The collector may comprise a plurality of reflective shells. The at least one of the plurality of planar members may be attached to one or more of the plurality of reflective shells.

At least two of the plurality of planar members may have different lengths.

The plurality of planar members may be foils.

The plurality of planar members may form at least a part of a contamination trap.

The plurality of planar members and collector may, in combination, be rotatable, for example about an optical axis.

According to an aspect of the present invention, there is provided a lithographic apparatus comprising: a radiation source according to an aspect of the present invention described above; an illumination system for conditioning the radiation; a support structure for supporting patterning device, the patterning device serving to impart the radiation beam with a pattern in its cross-section; a substrate table for holding a substrate; and a projection system for projecting the patterned radiation beam onto a target portion of the substrate.

According to an aspect of the present invention, there is provided a method of using the radiation source or lithographic apparatus according to the aspects of the present invention described above, the method comprising: rotating the collector and plurality of planar members, in combination, about an optical axis.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7a and 7b schematically depict part of a radiation source according to an embodiment of the invention.

DETAILED DESCRIPTION

Figure 1:
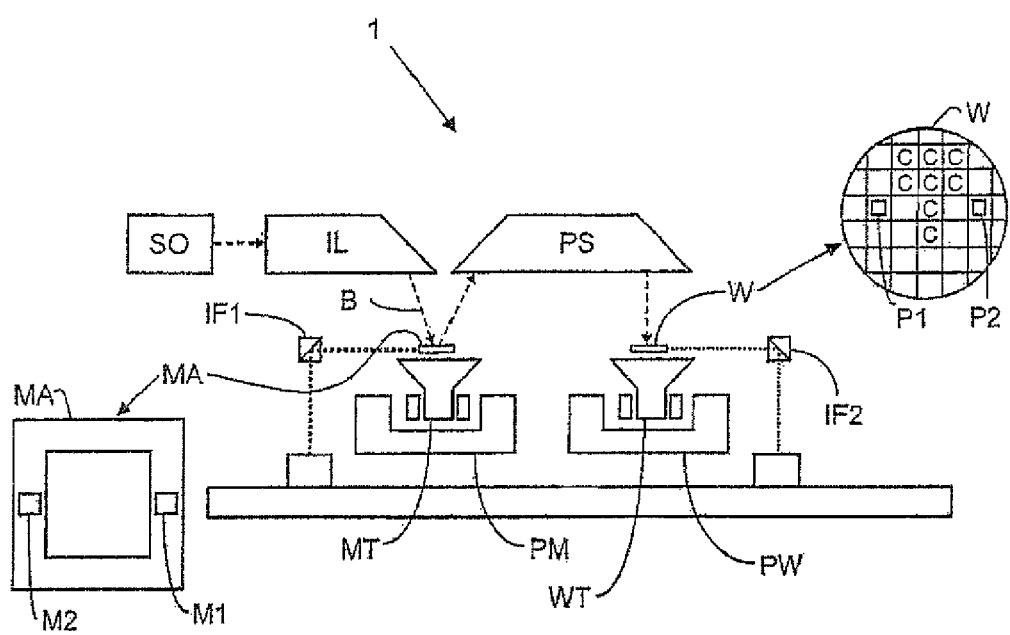
FIG. 1 schematically depicts a lithographic apparatus according to an embodiment of the invention.

FIG. 1 schematically depicts a lithographic apparatus 1 according to one embodiment of the invention. The apparatus 1 comprises: an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus 1, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in a EUV (or beyond EUV) radiation lithographic apparatus the optical elements will be reflective. However, other types of optical elements may be used. The optical elements may be in a vacuum. Any use of the term "projection lens" herein may be considered as synonymous with the more general term "projection system".

As here depicted, the apparatus 1 is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 1 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
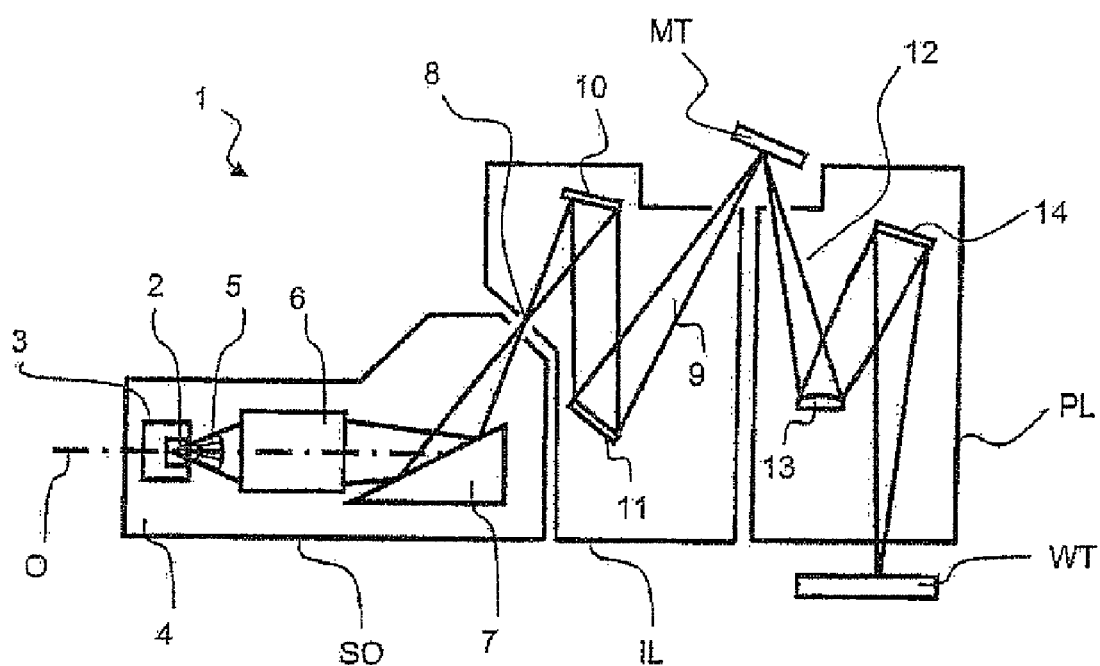
FIG. 2 schematically depicts a detailed schematic illustration of a lithographic apparatus according to an embodiment of the invention.

FIG. 2 shows the apparatus 1 in more detail, including a radiation source SO, an illumination optics unit IL, and the projection system (depicted as PL in FIG. 2). The radiation source SO includes a radiation emitter 2 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4.

The collector chamber 4 includes a contamination trap 5 and grazing incidence collector 6 (shown schematically as a rectangle). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a reticle or mask positioned on reticle or mask table MT. A patterned beam 12 is formed which is imaged in projection optics system PL via first and second reflective elements 13, 14 onto a substrate (not shown)

held on a substrate table WT. More elements than shown may generally be present in illumination optics unit IL and projection system PL.

Figure 3:
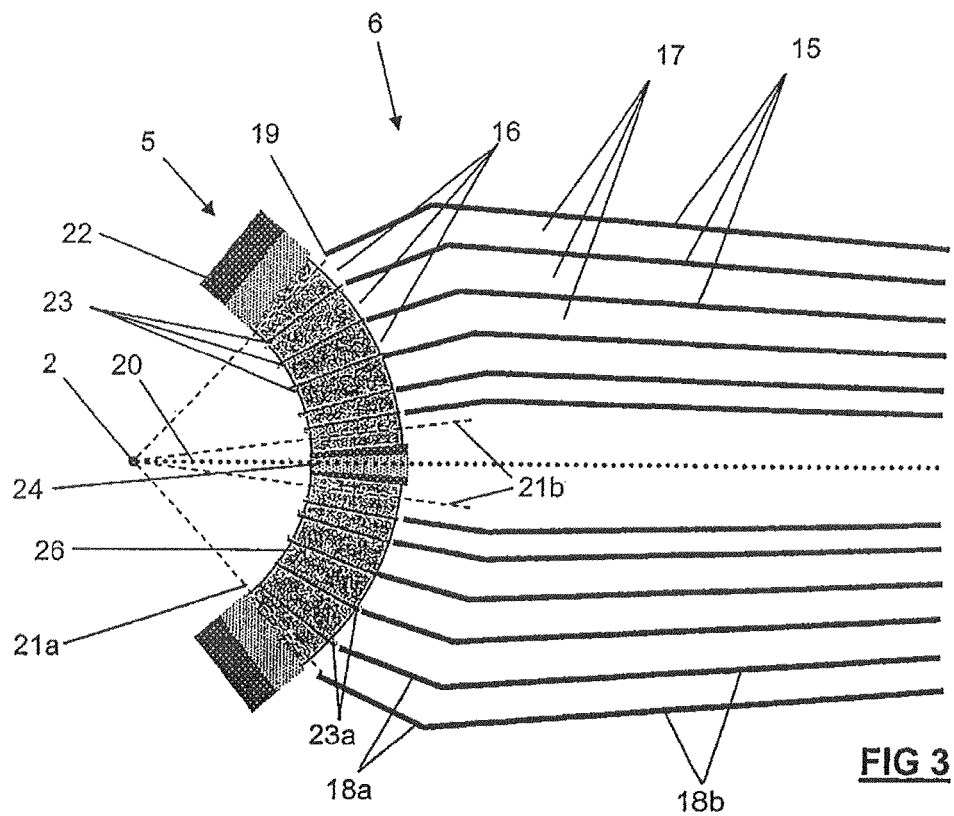
FIGS. 3 and 4 schematically depict part of a radiation source of the lithographic apparatus of FIG. 1 according to an embodiment of the invention.

FIG. 3 shows a schematic profile section of the grazing incidence collector 6 and of an associated contamination trap 5. The radiation emitter 2, from which EUV radiation and charged particles radiate, is also shown in FIG. 3. The grazing incidence collector 6 comprises six shells 15 which are formed from for example Ni with a Ru coating. The radially inner surfaces of each shell 15 are reflective to EUV radiation. Although six shells 15 are shown, any suitable number of shells may be used.

Each shell is circular in cross-section, and the shells are arranged co-axially around an axis which passes through the radiation emitter 2 (indicated by the dotted line 20). The shells combine to define five annular apertures 16 at an end of the grazing incidence collector 6 which is closest to the radiation emitter 2. EUV radiation generated by the radiation emitter 2 may enter the apertures 16 and pass into conduits 17 defined by the shells (each conduit is defined by a radially interior surface of a radially exterior shell 15 and a radially exterior surface of a radially interior shell 15).

Although each shell 15 is circular in cross section, the shells are not cylindrical. For example, the shells each typically include a first portion 18a which has a substantially hyperbolic shape and tapers inwardly in the general direction of the radiation emitter 2 and a second portion 18b which has a substantially elliptical shape. Although the first portion 18a of each shell 15 tapers generally towards the radiation emitter 2, it does not point directly at the radiation emitter but instead points at a location beyond the radiation emitter. For ease of illustration the first and second portions 18a,b of the shells are shown as straight lines in FIG. 3 rather than curved lines.

The effect of the shape of the shells 15 is that EUV radiation traveling from the radiation emitter 2 will be incident upon a radially interior surface of the first portion 18a of a given shell 15. The radiation will be reflected from the radially interior surface of the first portion 18a of the shell 15, and will be directed towards the radially interior surface of the second portion 18b of the shell. The radiation is reflected from this surface, and passes along a conduit 17 formed by that shell and an adjacent shell without undergoing further reflections. The EUV radiation then exits the grazing incidence collector and is incident upon the grating spectral filter 7 (see FIG. 2).

Each shell 15 has a finite thickness. This means that at an end of each shell 15 which is closest to the radiation emitter 2, the shell has a terminating edge 19. EUV radiation which is incident upon a terminating edge 19 of a shell will not enter the grazing incidence collector 6. This EUV radiation is therefore not collected and cannot be used by the lithographic apparatus.

The grazing incidence collector 6 has a finite radial extent, and so can only capture radiation from the radiation emitter 2 which falls within a particular range of angles. The terminating edge 19 of the outermost shell 15 combines with the radiation emitter 2 to define an outer conical trajectory outside of which radiation will not be collected by the grazing incidence collector (indicated in FIG. 3 by dashed lines 21a).

The innermost shell 15 combines with the radiation emitter 2 to define an inner conical trajectory within which radiation will not be collected by the grazing incidence collector (indicated schematically in FIG. 3 by dashed lines 21b).

The contamination trap 5 is provided between the radiation emitter 2 and the grazing incidence collector 6. The contamination trap 5 comprises an outer magnet 22 of substantially annular cross-section which lies outside the outer conical trajectory 21a. It also comprises an inner magnet 24 of substantially circular or annular cross-section which lies inside the inner conical trajectory 21b. In some instances a contamination trap 5 may be provided which does not include an inner magnet. The contamination trap 5 further comprises a set of five intermediate magnets 23 of substantially annular cross-section. Each of the intermediate magnets 23 is associated with a particular shell 15 of the grazing incidence collector 6.

The outer magnet 22, intermediate magnets 23 and inner magnet 24 combine to establish a magnetic field in the contamination trap 5. In FIG. 3, each magnet 22-24 has a dark side and a light side. These are intended to represent the magnetization direction (poles) of the magnets. The dark side represents the North pole of a magnet, and the light side represents the South pole of a magnet. The magnets are arranged such that a North pole of a given magnet faces a South pole of an adjacent magnet. Magnetic field lines of the magnetic field generated by the magnets thus pass from one magnet to the next, and thereby establish the magnetic field in the contamination trap 5. It will be appreciated that the magnets may be provided with opposite orientations (i.e. the dark side may represent the South pole of the magnet and the light side may represent the North pole of the magnet).

Although five intermediate magnets are shown, any suitable number of intermediate magnets may be used.

Figure 4:
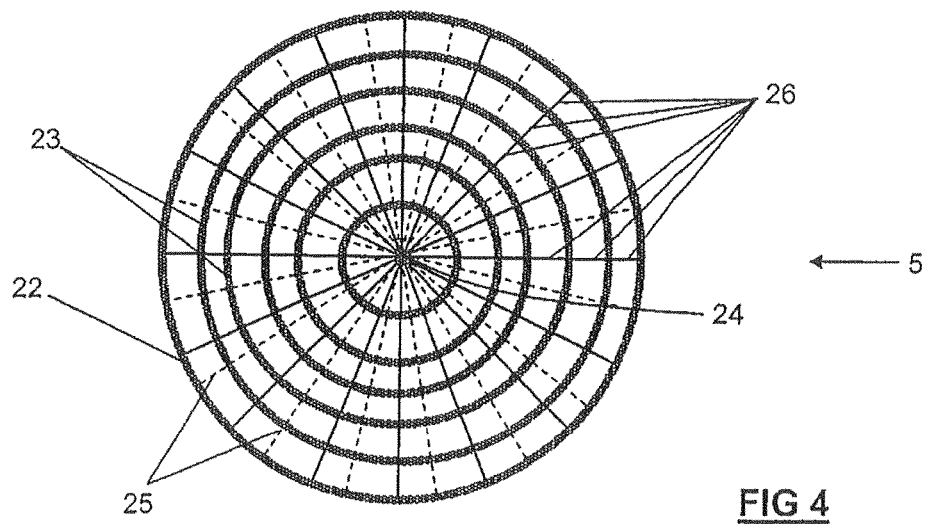

FIG. 4 shows schematically the magnets 22-24 viewed from the front. Field lines of the magnetic field which is established by the magnets are indicated schematically by dashed lines 25. The field lines extend radially outwardly from the inner magnet 24 to the outer magnet 22.

A plurality of planar foil members 26 are provided in the contamination trap 5. The foil members 26 are arranged parallel to the direction of travel of the EUV radiation from the radiation emitter 2 and perpendicular to the intermediate magnets 23. The foil members 26 extend between adjacent intermediate magnets 23, and are supported by the intermediate, inner and outer magnets 22-24. The foil members 26 may extend substantially radially. The foil members 26 have an axial length of approximately 30 mm, though it will be appreciated that the foil members may be of any suitable length between about 5 mm and about 200 mm, and more desirably between about 15 mm and about 40 mm. Although FIG. 4 shows radially adjacent foil members 26 as being aligned radially, it is not necessary for them to be aligned in this manner. Radially adjacent foil members 26 may for example be radially offset relative to one another.

Referring again to FIG. 3, each intermediate magnet 23 is associated with a shell 15 of the grazing incidence collector 6. Each intermediate magnet is substantially aligned with a shell 15 (this refers to the position of the intermediate magnet, and not to its orientation—it is not intended to mean that the intermediate magnet points in the same direction as the shell). Each intermediate magnet 23 has as an outer edge 23a which is substantially aligned with the terminating edge 19 of a shell 15 of the grazing incidence collector 6. Each intermediate magnet 23 points towards the radiation emitter 2, such that inner and outer faces of the intermediate magnet lie substantially parallel to the direction of travel of radiation emitted by the radiation emitter. Each intermediate magnet 23 is substantially annular, and may be said to have an annular frustoconical shape. The shape and position of each intermediate magnet 23 may alternatively be expressed by saying that each intermediate magnet 23 lies substantially within an annular conical volume, the point of the conical volume being defined by the radiation emitter 2 and the annular base of the annular conical volume being defined by the terminating edge 19 of a corresponding shell 16 of the grazing incidence collector 6.

The shape and position of each intermediate magnet 23 is such that EUV radiation (or a substantial part of EUV radiation) which is incident upon a given intermediate magnet 23 would have been incident upon a terminating edge 19 of a corresponding shell 15 in the absence of the intermediate magnet 23. Accordingly, providing intermediate magnets 23 which are associated with and adjacent the terminating edges 19 does not substantially reduce the quantity of EUV radiation which is collected by the grazing incidence collector 6. This is advantageous because it is desirable to direct as much EUV radiation as possible onto a substrate on the substrate table WT of the lithographic apparatus (see FIG. 1), so that the substrate can be exposed quickly.

The magnets 22-24 may comprise samarium cobalt (SmCo). Alternatively, the magnets 22-24 may comprise any appropriate material (for example a material with a suitable Curie temperature and which has a suitable resistance to hydrogen damage). The magnets 22-24 may comprise ferromagnetic material such as cobalt, iron or nickel. It is not essential that all of the magnets are permanent magnets. For example, some of the intermediate magnets 23 may comprise material which is not permanently magnetized. This material will nevertheless provide an advantageous effect in that it will help to concentrate the magnetic field generated by other magnets of the contamination trap. At least some of the magnets may be electromagnets. For example, the inner and outer magnets 22, 24 may be electromagnets.

The outer magnet 22 may be of any suitable annular thickness and is desirably in the range of about 0.5 mm to about 50 mm, and more desirably in the range of about 10 mm to about 50 mm. The annular thickness of the intermediate magnets 23 is desirably equal to or less than the thickness of the terminating edges 19 of the shells 15 of the grazing incidence collector 6. For example, the annular thickness of the intermediate magnets 23 may be in the range of about 0.5 mm to about 5 mm, and more desirably in the range of about 1 mm to about 3 mm. The thickness of the inner magnet 24 is desirably in the range of about 0.5 mm to about 50 mm, and more desirably in the range of about 10 mm to about 50 mm.

EUV radiation traveling through the contamination trap 5 towards the grazing incidence collector 6 is minimally affected by the foil members 26 due to their orientation being parallel to the direction of travel of the radiation. In the absence of a magnetic field, charged particles of contamination from the radiation emitter 2 would also be minimally affected by the foil members 26, since the direction of travel of the contamination would be the same as the direction of travel of the foil members. However, the magnetic field established by the magnets 22-24 across the contamination trap causes a Lorentz force to be exerted upon each charged particle of contamination, thereby modifying the trajectory of a charged particle which enters the contamination trap. The trajectory of the charged particle bends in a direction perpendicular to the direction of travel of the charged particle and perpendicular to the direction of the magnetic field. The modified trajectory of the charged particle causes the particle to travel towards, and be incident upon, a foil member 26. The charged particle is thereby trapped by the contamination trap 5, and does not reach the grazing incidence collector 6. The charged particle therefore is not able to damage the grazing incidence collector 6.

The provision of the intermediate magnets 23 increases the strength of the magnetic field in contamination trap 5, and hence its ability to capture charged particles (compared to the magnetic field which would have been provided if the intermediate magnets 23 were not present). The intermediate magnets 23 help to concentrate within the contamination trap the magnetic field which is generated by the inner 24 and outer 22 magnets.

Figure 5:
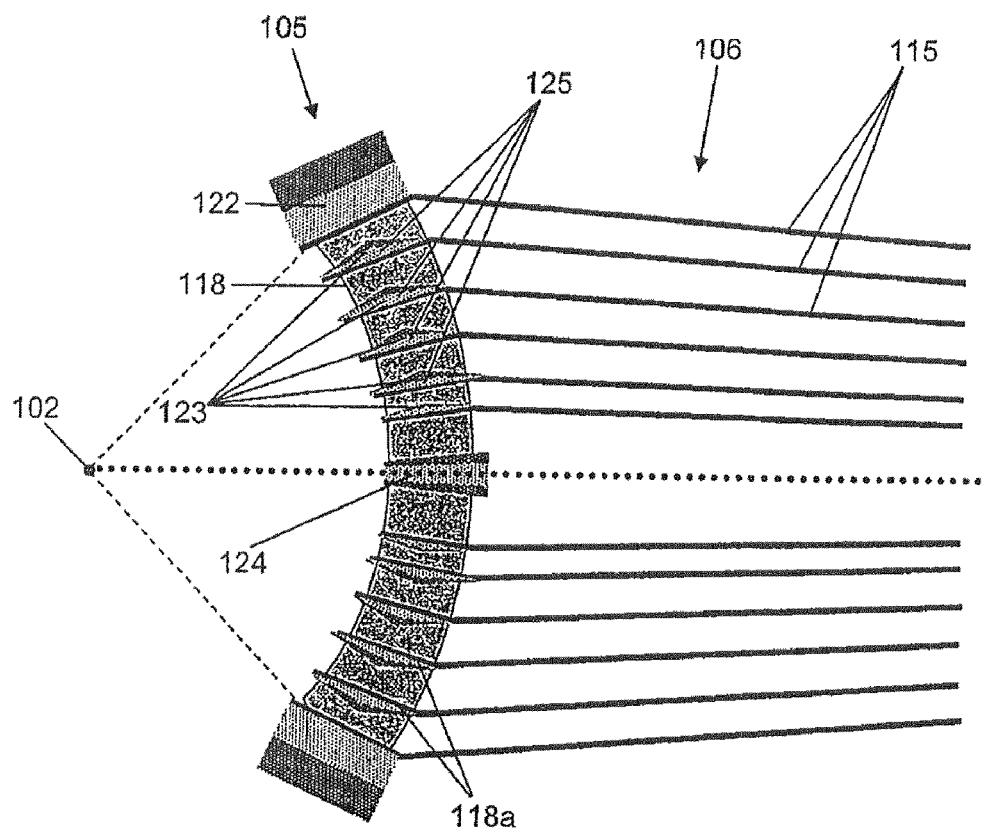
FIG. 5 schematically depicts part of a radiation source according to an embodiment of the invention.

An embodiment of the invention is shown in FIG. 5. Features of the embodiment of FIG. 5 which correspond with features of the embodiment of FIGS. 3 and 4 are given reference numerals which are corresponding but which have been incremented by 100.

FIG. 5 shows a schematic profile section of a contamination trap 105, a grazing incidence collector 106 and a radiation emitter 102. Rather than being positioned between the grazing incidence collector 106 and the radiation emitter 102, as in the first embodiment, parts of the contamination trap 105 are provided within the shells 115 of the grazing incidence collector 106.

As described further above, the shells 115 each include a first portion 118a which tapers inwardly towards a location beyond the radiation emitter 102. The effect of this is that EUV radiation traveling from the radiation emitter 102 will be incident upon a radially interior surface of the first portion 118a of each shell 115. As a consequence of this configuration, a shadow extends from the first portion 118a of each shell 115 into an area 125 adjacent the radially exterior surface of the first portion 118 of that shell. The area which is in shadow will be referred to as the shadow area 125. EUV radiation which travels from the radiation emitter 102 to the grazing incidence collector 106 does not pass through the shadow area 125. Elements such as intermediate magnets 123 may therefore be placed in the shadow area 125 without substantially reducing the quantity of EUV radiation that is collected by the collector 106.

The contamination trap 105 comprises a plurality of magnets 122-124, including five intermediate magnets 123 which are provided within the shadow areas 125 established by the shells 115. Each intermediate magnet is provided in the shadow area 125 of a different shell 115. Each intermediate magnet 123 is substantially annular in cross-section, and each has an inner surface which is in contact with, and is supported by, the outer surface of the first portion 118a of a corresponding shell 115. A given intermediate magnet 123 may be said to be associated with the shell 115 which supports it. An outer surface of each intermediate magnet 123 is shaped and dimensioned so that it does not extend beyond the shadow area 125 defined by the corresponding shell 115. Each intermediate magnet may be shaped and dimensioned so that it substantially fills the shadow area 125 defined by the corresponding shell.

The amount of space available within the shadow areas 125 may in some instances allow larger intermediate magnets 123 to be used than is the case in the embodiment shown in FIGS. 3 and 4. Furthermore, since the intermediate magnets 123 do not need to be aligned with terminating edges 19 of the shells 15, greater tolerances in the size and positioning of magnets may be possible. Providing parts of the contamination trap 105 within the grazing incidence collector 106 may help to ensure that the relative positioning of the trap 105 and grazing incidence collector 106 remains consistent.

Although they are not shown in FIG. 5, the contamination trap 105 may include substantially radially extending foil members which act to trap contamination.

In FIGS. 3 to 5, an intermediate magnet 23, 123 is associated with each shell 15, 115 of the grazing incidence collector 6, 106 with the exception of the outermost shell. However, in some instances, some of the shells may not be provided with intermediate magnets. For example, a contamination trap may comprise an outer magnet 22, 122, a single intermediate magnet 23, 123 and an inner magnet 24, 124. Alternatively, two intermediate magnets or more may be used. In one example, an intermediate magnet 23, 123 may be associated with every other shell 15, 115. In some instances, it may not be desirable to provide an inner magnet 24, 124. The arrangement of magnets which is used for a given collector may depend upon the strength of the magnetic field which it is desired to have within that collector.

Although the grazing incidence collectors 6, 106 shown in FIGS. 3 to 5 have six shells, any other suitable number of shells may be used.

In the above description of the embodiments of the invention, intermediate magnets 23, 123 have been described as being associated with shells 15, 115. The term 'associated with' is intended to encompass for example an intermediate magnet being substantially aligned with a shell, or being located in a shadow area which extends from a shell 15.

Figure 6:
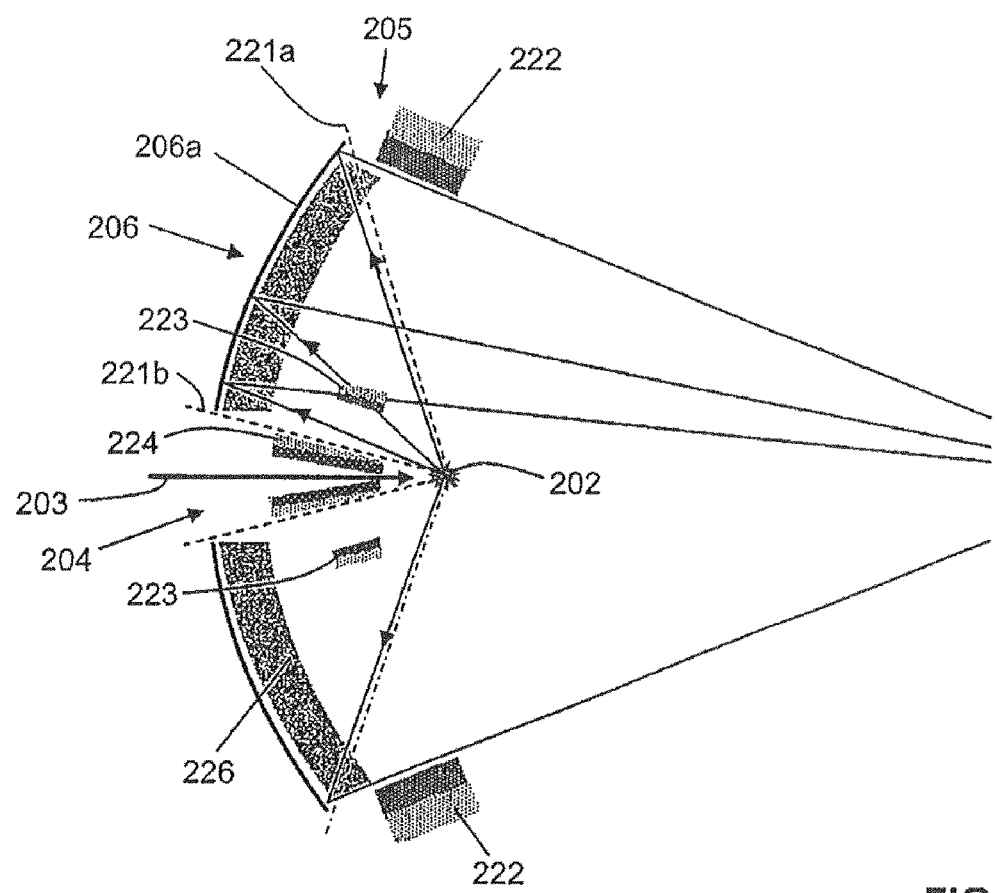
FIG. 6 schematically depicts part of a radiation source according to an embodiment of the invention.

An embodiment of the invention is shown in FIG. 6. FIG. 6 shows a schematic profile section of a normal incidence collector 206, a contamination trap 205 and a radiation emitter 202. The radiation emitter may for example comprise a tin particle which is vaporized by a laser beam 203. The normal incidence collector 206 comprises an elliptically curved collector mirror 206a. The radiation emitter 202 is located at a first focus of the curve, and an output point (not shown) for EUV radiation collected by the collector is located at a second focus of the curve.

The collector mirror 206a has a finite radial extent, and so can only capture radiation from the radiation emitter 202 which falls within a particular range of angles. An outer edge of the collector mirror 206a combines with the radiation emitter 202 to define an outer conical trajectory outside of which radiation will not be collected by the collector mirror (indicated schematically in FIG. 6 by dashed lines 212a).

The collector mirror 206a is provided with an aperture 204 at its center, which allows the laser beam 203 to reach the radiation emitter 202. The aperture 204 combines with the radiation emitter 202 to define an inner conical trajectory within which radiation will not be collected by the collector mirror (indicated schematically in FIG. 6 by dashed lines 221b).

The contamination trap 205 comprises a plurality of foils 226 which extend substantially radially, and a plurality of magnets 222-224 which are arranged to generate a radially extending magnetic field. The magnets comprise an outer magnet 222 which is substantially annular in shape and which lies outside of the outer conical trajectory of radiation which is collected by the collector mirror 206a, and an inner magnet 224 which is substantially cylindrical in shape and which lies inside of the inner conical trajectory of radiation which is collected by the collector mirror 206a. A further magnet 223, which is substantially annular in shape is located between the inner and outer magnets 222, 224. This further magnet, which will be referred to as the intermediate magnet 223, lies within the trajectory of radiation which is collected by the collector mirror 206a.

The intermediate magnet 223 may be advantageous because it may strengthen the radially extending magnetic field through which contamination must pass on its way to the collector mirror 206a. This strengthening of the magnetic field helps to deviate contamination onto the radially extending foils 226. The intermediate magnet 223 may therefore provide trapping of contamination which would not otherwise have been trapped if the intermediate magnet 223 were not present.

In some instances it may not be desirable to provide the inner magnet 224.

The intermediate magnet 223 blocks some EUV radiation, thereby preventing it from reaching the collector mirror 206a. It may also block some EUV radiation which has been incident upon the collector mirror 206a and which has been reflected towards the output of the normal incidence collector. This reduces the amount of EUV radiation which passes to subsequent parts of the lithographic apparatus. However, this potential disadvantage may be considered in some instances to be more than compensated for by the improved contamination trapping performance which the intermediate magnet 223 may provide.

It may be desired to limit the amount of EUV radiation which is blocked by the intermediate magnet 223. One way in which this may be achieved is by choosing an appropriate shape for the intermediate magnet 223. For example, the intermediate magnet may be elongate (i.e. have a longer side and a shorter side), and thereby present a relatively narrow profile to the EUV radiation. The intermediate magnet may have a longer side which is oriented substantially parallel to the direction in which the radiation is emitted from the radiation emitter 202, or substantially parallel to the direction in which radiation is reflected from the collector mirror 206a to an intermediate focus point, or parallel to any direction which lies between these two directions. Another way in which the amount of EUV radiation which is blocked by the intermediate magnet 223 may be limited is by locating the intermediate magnet closer to the center of the collector mirror 206a than to the outside of the collector mirror. Less EUV radiation is collected in locations close to the center of the collector mirror 206a than in locations further from the center. The intermediate magnet may for example be at a location which is less than about 50% of the distance between the center and the outside of the collector mirror, may be less than about 40% of the distance between the center and the outside of the collector mirror, and may be less than about 30% of the distance between the center and the outside of the collector mirror.

The extent of the radially extending foils 226 may correspond with the extent of the collector mirror 206a, such that the radially extending foils to not meet at a central axis but instead end at the aperture 204 in the collector mirror.

The radially extending foils 226 may be arranged to rotate about an axis (the axis may be correspond with towards which the foils radially extend). Where this is the case, the magnetic field is desirably rotationally symmetric, to limit electromagnetic induction which may occur in the foils.

The magnetic field generated by the magnets of the embodiments of the invention desirably comprises a substantially radial component which is substantially perpendicular to the direction of travel of the charged particle contamination. However, the magnetic field may include components which are oriented in other directions. The magnetic field should be arranged such that it deflects charged particles towards foils which are intended to trap the charged particles.

Annular or cylindrical permanent magnets may be difficult to manufacture in one piece, particularly when the magnetization direction is radial. Therefore, the outer magnet 22, 122, 222, the intermediate magnets 23, 123, 223 and/or the inner magnet 24, 124, 224 may comprise a plurality of segments with different magnetization directions which together produce a desired magnetic field. The segments may be separate magnets.

The term annular magnet is intended to cover for example a plurality of segments with different magnetization directions which together produce a magnetic field resembling that which would be produced by an annular magnet. Similarly, the term cylindrical magnet is intended to cover for example a plurality of segments with different magnetization directions which together produce a magnetic field resembling that which would be produced by a cylindrical magnet. The term annular frusto-conical shape when used in relation to a magnet is intended to cover for example a plurality of segments with different magnetization directions which together produce a magnetic field resembling that which would be produced by a magnet having an annular frusto-conical shape.

The annular magnets, cylindrical magnets and annular frusto-conical magnets may be considered to be examples of magnet rings. The magnet rings may be made from segments having different magnetization directions which together produce a desired magnetic field. The magnetic field may resemble that which would be provided for example by an annular magnet, cylindrical magnet or annular frusto-conical magnet. The segments may be different magnets.

The contamination trapping provided by the embodiments of the invention may be supplemented by other contamination mitigation methods including for example the use of a buffer gas. A rotating foil trap may be used in addition to the embodiments of the invention described herein.

As discussed above, the heat load on the planar foil members of a foil trap and/or the buffer gas used in conjunction with such a foil trap may be unacceptably high. There is therefore a desire to reduce this heat load. In order to reduce the heat load, the planar foil members of the foil trap should be cooled. Because the planar foil members are thin, it may be difficult to include within the planar foil members an active cooling system such as, for example, channels through which a fluid may flow.

In accordance with an embodiment of the present invention, the collector and foil trap are arranged such that one or more planar foil members of the foil trap are in contact with the collector. The contact may be direct. For example, the planar foil members of the foil trap may be directly attached to the collector. The contact may be indirect. For example, the planar foil members of the foil trap may be attached to the collector via a fixing (e.g. a screw, bolt, or adhesive). The heat present in the planar foil members of the foil trap may be dissipated more easily through conduction of the heat to the collector. Similarly, any buffer gas present in the vicinity of the planar foil members may also dissipate heat through the foil members and the collector. The collector may be actively cooled using, for example, a fluid channel cooling system, further increasing the dissipation of heat from the planar foil members. Specific embodiments of the invention will now be described.

FIG. 7a shows, in general, the same schematic profile section of the normal incidence collector 206, the contamination trap 205 (i.e. foil trap) and the radiation emitter 202 of FIG. 6. Features shown in and described with reference to FIG. 6 are given the same reference numerals in FIG. 7a. However, in contrast with FIG. 6, FIG. 7a shows that the collector 206 is in contact with the planar foil members 226 of the contamination trap 205. In particular, FIG. 7a shows that the collector mirror 206a is in contact with the planar foil members 226 of the contamination trap 205. Heat present in the planar foil members 226 may be dissipated via conduction through the collector mirror 206a, thereby reducing the heat load on the planar foil members 226.

The planar foil members 226 are aligned such that they are radially aligned with respect to the radiation emitter 202 (i.e. the emission point of radiation), so that the planar foil members 226 obscure as little radiation as possible that is emitted from the radiation emitter 202. In other words, the planar foil members 226 are oriented such that they are parallel to the direction of travel of the radiation.

The foil members 226 may be connected (or attached to) the collector 206 in any suitable manner. In one example, slits are provided in the collector 206 (for example, before a reflective coating is provided to form the collector mirror 206a). The slits may be provided using, for example, a laser cutting arrangement or by electric discharge machining. The planar foil members 226 are then inserted through the slits and secured on the back-side (i.e. non-reflecting side) of the collector 206 by soldering or the like. Such an arrangement ensures good thermal contact between the planar foil members 226 and the collector 206 with little or no decrease in the amount of radiation that can be collected (or in other words reflected) by the collector 206. This is because, even if no slits were provided, the areas of the collector 206 in which slits are provided would be prevented from reflecting radiation by the presence of the planar foils members 226.

A further reduction in the heat load on the planar foil members 226 (or, in other words, further cooling of the planar foil members 226) can be achieved by actively cooling the collector 206. For example, channels for carrying a fluid can be formed in the collector 206, or on the back-side of the collector 206. A fluid such as water can be passed through the channels in order to absorb and take away heat from the collector 206 and thus the planar foil members 226.

As discussed above, a buffer gas may be used in conjunction with the planar foil members 226 to improve the trapping of contamination. FIG. 7b shows an end-on view of the normal incidence collector 206 shown in and described with reference to FIG. 7a. FIG. 7b shows that apertures 206b are provided in the collector mirror 206a. A buffer gas may be inserted in-between the planar foil members 226 from the back-side of the collector 206 via the apertures 206b.

The planar foil members may be appropriately located in order to create a significant pressure drop in between the planar foil members 226. A significant pressure drop may keep most of the gas in the foil trap, where the gas helps to trap particles, or where the foil trap helps to cool the gas.

The planar foil members 226 may have different lengths (the length being measured from the center of the collector mirror 206a outwards). For example, if the planar foil members 226 all extended from the periphery of the collector mirror 206a to the aperture in the collector mirror 204, the density of the planar foil members 226 in the area surrounding the aperture 204 may be such that the intensity of radiation reflected from that area is significantly reduced. Therefore, half-length foil members may be added in-between full-length foil members. By using planar foil members having different lengths, a more uniform and average foil spacing may be achieved across surface of the collector mirror 206a. For example, planar foil members 226 having any suitable length (e.g. one-third or one-sixth of a full length planar foil member 226) may be provided to establish a more uniform and average foil spacing across the surface of the collector mirror 206a.

Figure 8:
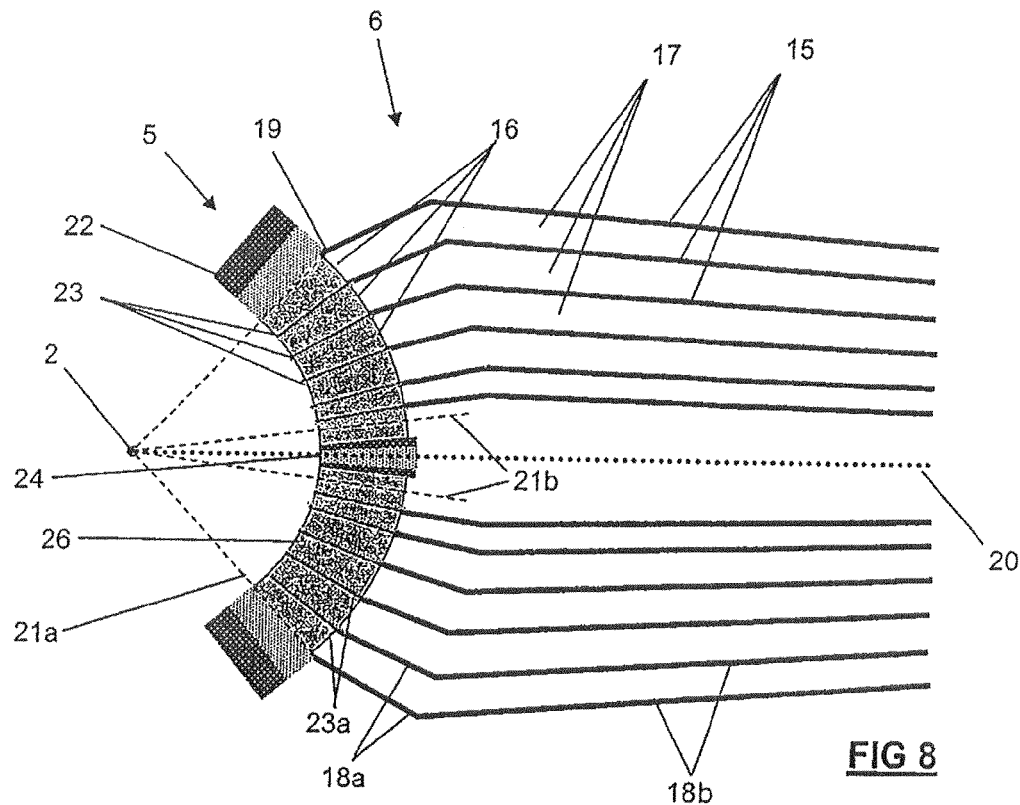
FIGS. 8 and 9 schematically depict part of a radiation source according to an embodiment of the invention.
Figure 9:
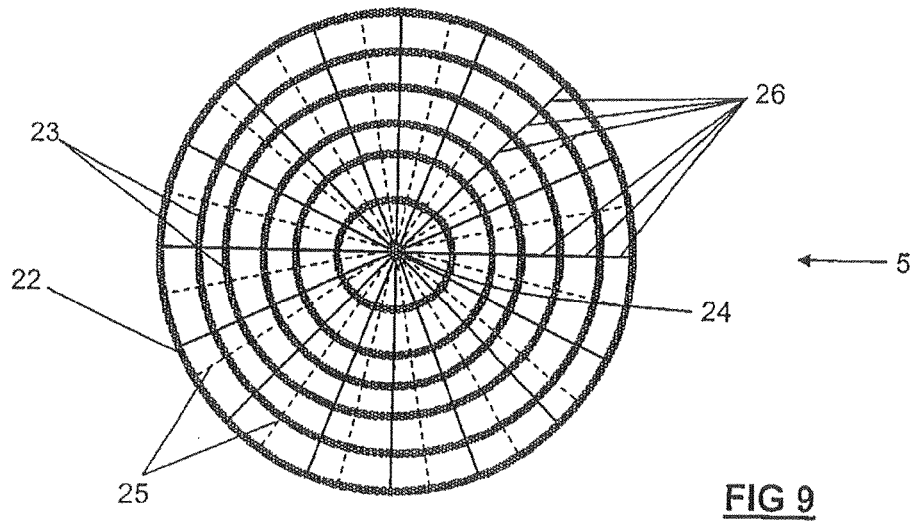

FIGS. 8 and 9 schematically depict an embodiment of the present invention. FIG. 8 shows, in general, the same schematic profile section of the grazing incidence collector 6, the contamination trap 5 (i.e. foil trap) and the radiation emitter 2 of FIG. 3. FIG. 9 shows an end-on view of the contamination trap 5. Features shown in and described with reference to FIGS. 3 and 4 are given the same reference numerals in FIGS. 8 and 9. However, in contrast with FIGS. 3 and 4, FIGS. 8 and 9 show that the collector 6 is in contact with the planar foil members 26 of the contamination trap 5. In particular, FIGS. 8 and 9 show that the shells 15 of the collector 6 are in contact with the planar foil members 26 of the contamination trap 5. Heat present in the planar foil members 26 (and a buffer gas in the vicinity of the planar foil members 26) may be dissipated via conduction through the collector shells 15 thereby reducing the heat load on the planar foil members 26.

In some embodiments, surfaces of the collector are cleaned using, for example, a gas. In such embodiments, the foil traps described above will no longer need to trap contamination. In such embodiments, the foil traps may therefore no longer be considered as traps. For instance, in embodiments where trapping of contamination is no longer desired, the foil traps may serve as cooling members. The planar members may also be formed from materials others than foils, such as for example one or more layers of metal too great in thickness to be considered as a foil. In general, therefore, the planar foil trap members described above may be more generically described as planar members that are aligned such that they are radially aligned with respect to the emission point, so that the planar members obscure as little radiation as possible that is emitted from the emission point. In other words, the planar foil members are oriented such that they are parallel to the direction of travel of the radiation.

In some applications where the collector is attached to the planar members that are aligned radially with respect to the emission point, it may be desirable to rotate the collector and planar members (in combination) about an optical axis. This is so that any shadows (or in other words blocking or obscurations) caused by the planar members will be averaged out over the entire collection angle. The collector and planar member arrangement may be rotated, for example, when a gas is used to clean the collector, and the planar members are not serving as contamination traps. This is because there will be no risk of re-emission of contamination from the planar members due to centrifugal forces induced during rotation.

In some instances it may not be desirable to provide all or any of the magnets shown in and described with reference to FIGS. 7 to 9. The principles shown in and described with reference to FIGS. 7 to 9 do not depend on the incorporation of such magnets.

In some embodiments, not all of the planar members are in contact with the collector. However, in order to reduce the heat load on the planar members, desirably a majority of the planar members are in contact with the collector, and desirably all of the planar members are in contact with the collector.

Although the embodiments of the invention have been described in relation to a conventional grazing incidence collector, and to a conventional normal incidence collector, the invention may be applied to other forms of collector. This includes collectors which have a similar construction to the illustrated grazing incidence collector but in which the incidence angles are not all grazing. In some instances for example a collector may collect at large collection angles (e.g. >70° from the optical axis). Where this occurs, the reflection angles on the outer shells of the collector become so large that it may be advantageous to coat the outer shells with a reflective multilayer coating. Such a collector could be argued to no longer be a grazing-incidence collector in the strictest sense. Furthermore, there exist collector designs based on two near-normal-incidence reflections, in which there is generally a volume between the source and the first reflection through which radiation passes once. When magnet rings with an elongate shape as described above are placed in this volume, they only obscure radiation passing in one direction (rather than radiation passing in two directions as per the embodiment described above in relation to FIG. 6). Therefore, the extent to which they obscure radiation is reduced.

Embodiments of the invention are not limited to radiation sources which use droplets of material. An embodiment of the invention may for example generate plasma from a gas rather than from droplets of material. Both of these may be considered to be examples of a plasma generating substance.

Although the above description of embodiments of the invention relates to a radiation source which generates EUV radiation, the invention may also be embodied in a radiation source which generates 'beyond EUV' radiation, that is radiation with a wavelength of less than 10 nm. Beyond EUV radiation may for example have a wavelength of 6.7 nm or 6.8 nm. A radiation source which generates beyond EUV radiation may operate in the same manner as the radiation sources described above.

The description above is intended to be illustrative, not limiting. Thus, it will be apparent to one skilled in the art that modifications may be made to the invention as described without departing from the scope of the claims set out below.

What is claimed is:

1. A radiation source comprising:
   a radiation emitter configured to emit radiation;
   a collector constructed and arranged to collect the radiation, the collector comprising a plurality of reflective shells provided within one another; and
   a contamination trap constructed and arranged to trap contamination emitted by the radiation emitter, the contamination trap comprising a plurality of foils that extend substantially radially, a first magnet ring configured to lie outside of an outer conical trajectory of radiation that is collected by the collector, and a second magnet ring configured to lie within the trajectory of radiation that is collected by the collector and substantially aligned with a reflective shell of the collector, wherein the magnet rings are configured to provide a magnetic field that includes a component that is parallel to the foils, and wherein the foils are provided between the reflective shells of the collector.

2. The radiation source of claim 1, wherein the contamination trap further comprises a intermediate magnet ring positioned between the first magnet ring and the second magnet ring.

3. The radiation source of claim 2, wherein the intermediate magnet ring is substantially aligned with a different reflective shell of the collector.

4. The radiation source of claim 1, wherein the contamination trap further comprises a plurality of magnet rings substantially aligned with at least half of the reflective shells of the collector.

5. The radiation source of claim 4, wherein at least one of the magnet rings is provided between a terminating edge of one of the reflective shells and the radiation emitter.

6. The radiation source of claim 5, wherein the at least one magnet ring points towards the radiation emitter such that inner and outer faces of the magnet ring lie substantially parallel to the direction of travel of radiation emitted by the radiation emitter towards the collector.

7. The radiation source of claim 4, wherein at least one of the magnet rings is provided in the collector in a shadow area that extends from one of the reflective shells.

8. The radiation source of claim 1, wherein the collector comprises a collector mirror arranged to receive the radiation from the radiation emitter and reflect the radiation towards a focus.

9. The radiation source of claim 8, wherein the second magnet ring is longer in a direction parallel to a first direction in which the radiation is emitted from the radiation emitter towards the collector than in a second direction that is perpendicular to the first direction.

10. The radiation source of claim 8, wherein the second magnet ring is closer to the center of the collector mirror than to the outside of the collector mirror.

11. A lithographic apparatus comprising:
- a radiation source comprising
    - a radiation emitter configured to emit radiation;
    - a collector constructed and arranged to collect the radiation, the collector comprising a plurality of reflective shells provided within one another; and
    - a contamination trap constructed and arranged to trap contamination emitted by the radiation emitter, the contamination trap comprising a plurality of foils that extend substantially radially, a first magnet ring configured to lie outside of an outer conical trajectory of radiation that is collected by the collector, and a second magnet ring configured to lie within the trajectory of radiation that is collected by the collector and substantially aligned with a reflective shell of the collector, wherein the magnet rings are configured to provide a magnetic field that includes a component that is parallel to the foils, and wherein the foils are provided between the reflective shells of the collector;
- an illumination system configured to condition the radiation into a radiation beam;
- a support structure configured to support a patterning device, the patterning device being configured to impart the radiation beam with a pattern in its cross-section;
- a substrate table configured to hold a substrate; and
- a projection system configured to project the patterned radiation beam onto a target portion of the substrate.

* * * * *